(12) United States Patent
Habenicht

(10) Patent No.: US 8,809,695 B2
(45) Date of Patent: Aug. 19, 2014

(54) CONTACT STRUCTURE FOR AN ELECTRONIC CIRCUIT SUBSTRATE AND ELECTRONIC CIRCUIT COMPRISING SAID CONTACT STRUCTURE

(75) Inventor: Soenke Habenicht, Hamburg (DE)

(73) Assignee: NXP B.V., Eindhoven (NL)

( * ) Notice: Subject to any disclaimer, the term of this patent is extended or adjusted under 35 U.S.C. 154(b) by 535 days.

(21) Appl. No.: 12/744,368

(22) PCT Filed: Oct. 22, 2008

(86) PCT No.: PCT/IB2008/054342
§ 371 (c)(1),
(2), (4) Date: May 24, 2010

(87) PCT Pub. No.: WO2009/069020
PCT Pub. Date: Jun. 4, 2009

(65) Prior Publication Data
US 2010/0244275 A1    Sep. 30, 2010

(30) Foreign Application Priority Data
Nov. 27, 2007 (EP) ..................... 07121596

(51) Int. Cl.
*H05K 1/11* (2006.01)
*H05K 1/00* (2006.01)
*H01L 23/482* (2006.01)

(52) U.S. Cl.
CPC ..... *H01L 23/4824* (2013.01); *H01L 2924/0002* (2013.01)
USPC .......................... 174/261; 174/258

(58) Field of Classification Search
CPC .................................. H01L 23/4824
USPC ................ 174/261, 262, 250, 265, 257, 258; 257/774
See application file for complete search history.

(56) References Cited

U.S. PATENT DOCUMENTS

| | | | | |
|---|---|---|---|---|
| 4,664,962 A | * | 5/1987 | DesMarais, Jr. | 174/261 |
| 5,262,352 A | * | 11/1993 | Woo et al. | 257/E21.585 |
| 5,455,449 A | | 10/1995 | Inn | |
| 5,529,956 A | * | 6/1996 | Morishita | 257/E21.585 |
| 5,723,897 A | | 3/1998 | Leighton et al. | |
| 5,779,836 A | * | 7/1998 | Kerrick | 427/97.2 |

(Continued)

FOREIGN PATENT DOCUMENTS

| | | |
|---|---|---|
| EP | 1728276 A1 | 12/2006 |
| JP | 08306701 A | 11/1996 |

(Continued)

OTHER PUBLICATIONS

International Written Opinion for Application No. PCT/IB2008/054342 (October 22, 2008).

*Primary Examiner* — Chau N Nguyen
*Assistant Examiner* — Roshn Varghese

(57) ABSTRACT

A substrate for an electronic circuit is provided wherein the substrate comprises a plurality of contact areas (304), a plurality of dielectric areas (307), and a conductor path (301), wherein each of the plurality of contact areas is surrounded by a respective one of the dielectric areas, and wherein at least two of the contact areas are connected with each other by the conductor path. Furthermore, the conductor path is formed at the dielectric area in such a way that it completely covers the dielectric area.

8 Claims, 5 Drawing Sheets

(56) References Cited

U.S. PATENT DOCUMENTS

| | | | |
|---|---|---|---|
| 6,111,205 A * | 8/2000 | Leddige et al. | 174/260 |
| 6,124,164 A * | 9/2000 | Al-Shareef et al. | 257/E21.009 |
| 6,630,627 B1 * | 10/2003 | Tobita | 174/255 |
| 6,831,330 B2 * | 12/2004 | Harshfield | 257/E23.145 |
| 7,743,494 B2 * | 6/2010 | Wang et al. | 174/262 |
| 7,781,889 B2 * | 8/2010 | Leader et al. | 257/774 |
| 7,804,695 B2 * | 9/2010 | Thevenard et al. | 174/262 |
| 2006/0091495 A1 * | 5/2006 | Palanduz et al. | 257/532 |
| 2006/0220178 A1 | 10/2006 | Kubo et al. | |
| 2010/0065321 A1 * | 3/2010 | Kashiwakura | 174/261 |

FOREIGN PATENT DOCUMENTS

| | | |
|---|---|---|
| JP | 2000 040703 A | 2/2000 |
| JP | 2001 217254 A | 10/2001 |
| WO | 2007017786 | 2/2007 |

* cited by examiner

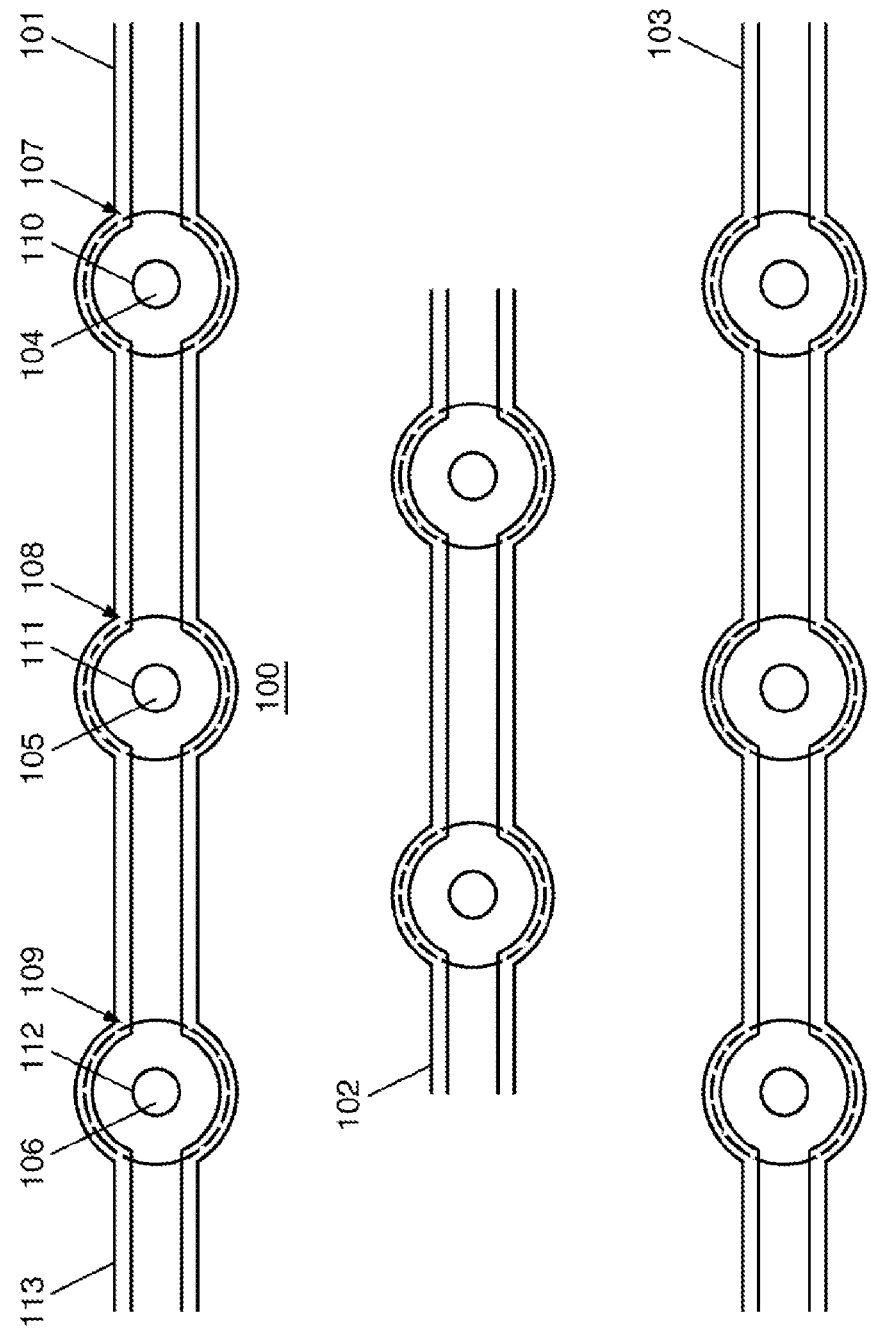

CONTACT STRUCTURE FOR AN ELECTRONIC CIRCUIT SUBSTRATE AND ELECTRONIC CIRCUIT COMPRISING SAID CONTACT STRUCTURE

FIELD OF THE INVENTION

The invention relates to a substrate for an electronic circuit. The invention further relates to an electronic circuit.

BACKGROUND OF THE INVENTION

Many semiconductor devices of electronic circuits or integrated circuits are housed or cast into plastic or resin in order to protect the semiconductor devices against environmental influences like humidity or dirt. An upper surface of a semiconductor crystal, e.g. silicon or another semiconducting material like germanium, gallium-arsenic or gallium-nitrogen, supports a number of structured thin layers, in particular one or more electrically conductive layers or conductors comprising aluminium, aluminium-silicon, aluminium-silicon-copper or gold, and one or more electrically insulating layers or passivating layers. These semiconductor devices are generally produced on wafers and may be subsequently singularized, e.g. by sawing the wafer. The electrically insulating layers may consist of silicon-oxide, silicon-nitride, and silicon-oxide-nitride. Furthermore, the electrically conductive layers comprise so-called contact pads, which can be connected to external terminals or bond pads of the semiconductor device. In the course of the mounting of a semiconductor package comprising the semiconductor device the semiconductor device, called crystal or chip as well, is mounted on a carrier or carrier pad, and the bond pads and terminals of the package, e.g. a lead frame of the package, are electrically connected by bonding, e.g. by bondwires. Afterwards the package or chip is cast into a resin or plastic material which forms an envelope protecting the chip against humidity dirt or the like. The cast material also sticks to the thin conductive or non-conductive layers described above.

A possible connecting of the semiconductor devices, e.g. base and emitter areas or regions of a bipolar transistor, may be based on a mesh-like structure of conductor paths formed in such a way that contact areas or vias, which are connected to the semiconductor devices, are contacted by the conductor paths. These conductor paths are made of metallic material and are formed on the contact areas, contact pads or vias and are guided through dielectric areas formed as an insulating layer around the contact areas. The contact areas may be connected to respective semiconductor devices by using wires or conductor paths formed through vias.

However, the metal conductor paths in the known packages may separate or delaminate from the non-conductive layer formed around the contact areas. Such a separation may cause failure of the package and is thus a matter of present research. To decrease the probability of delamination variation of known deposition or structuring procedures are performed. For example, it is attempted to decrease the delamination probability by increasing etching temperatures of the non-conductive areas or by doping the structured non-conductive areas.

OBJECT AND SUMMARY OF THE INVENTION

It may be an object of the invention to provide a substrate having an alternative arrangement of conductor paths for active zones of the substrate, wherein the arrangement of the conductor paths may lead to a decreased probability of delamination or may ensure an improved performance of a semiconductor device or electronic circuit the substrate is used in.

In order to achieve the object defined above, a substrate for an electronic circuit and an electronic circuit, e.g. a semiconductor circuit or device, according to the independent claims are provided.

According to an exemplary embodiment of the invention a substrate for an electronic circuit is provided wherein the substrate comprises a plurality of contact areas, a plurality of dielectric areas, and a conductor path, wherein each of the plurality of contact areas is surrounded by a respective one of the dielectric areas, and wherein at least two of the contact areas are connected with each other by the conductor path. Furthermore, the conductor path is formed at the dielectric area in such a way that it completely covers the dielectric area. In particular, the conductor path may be formed by a metallic component and may form a path connecting the plurality of contact areas with each other.

According to an exemplary embodiment of the invention an electronic circuit is provided which comprises a substrate according to an exemplary embodiment of the invention and a plurality of semiconductor devices, wherein the semiconductor devices are electrically connected to the contact areas. In particular, at least some of the semiconductor devices are formed by transistors, in particular bipolar transistors. Furthermore, the dielectric areas may be formed by a base-emitter oxide.

In this application the term "contact areas" may particularly denote any kind of area or region on a substrate which may be adapted to electrically contact elements, e.g. transistors or the like, formed on the substrate. These contact areas may be formed by vias filled with electrically conductive material or may be formed by so-called contact pads.

In this application the term "completely cover" may particularly denote the fact that a layer, e.g. the conductor path, may be arranged in such a way on a layer underneath that the conductor path forms a blanket or covering layer on the underneath layer. For example, in case the lower layer has a circular form of a first diameter, the conductor path, which completely covers the lower layer, may have a width or a diameter which is at least the same size or greater than the first diameter. Thus, in a process the lower layer may be formed and in a step directly afterwards or after some intermediate steps the conductor path may be formed on the lower layer so that no part of the lower layer is exposed to the environment any more. It should be noted that "lower" is not meant in a restrictive sense and in particular not with respect to any specific reference system.

By providing a conductor path which completely covers contact areas and surrounding non-conductive areas, e.g. oxide layers used to passivate the contact areas, it may be possible to avoid so-called crossovers of the conductor paths and the non-conductive areas. That is, it may be possible to avoid intersections of these two layers which intersections may otherwise facilitate a delamination process or facilitate an underetching of the conductor path at the intersection areas or regions. Such underetching would possibly facilitate the formation of so-called necks, i.e. thinned portions of the conductor path. These necks may cause weakening of the structure in known semiconductor devices which may be avoided by using a substrate according to an exemplary embodiment having conductor paths which completely cover the underlying non-conductive area, e.g. an oxide used for structuring the substrate or passivating layers of the substrate. Thus, the use of a substrate according to an exemplary embodiment may provide for an electronic circuit or integrated circuit having an improved lifetime, performance and quality.

A substrate according to an exemplary embodiment may reduce the probability of occurrence of underetching or generating of necks in further processing steps of the substrate without implementing new, complex and costly new processing steps, like increased temperatures, ion doping, dry etching or the use of different masks. Furthermore, it may be possible to increase the performance of electronic circuits using such a substrate. Additionally, it may be possible to transfer higher current densities for a given conductor path width or a smaller width of the conductor path may be chosen for the same current density.

A gist of an exemplary aspect of the invention may be seen in providing a substrate, e.g. a semiconductor substrate, which may be used for an electronic circuit, e.g. an integrated circuit, wherein a crossover or intersection of a conductor path and non-conductive areas formed around contact areas to be connected by the conductor paths are avoided. This avoiding may be performed by entirely covering the non-conductive or dielectric areas by the conductor paths, e.g. metal conductor paths. Thus, it may be possible to avoid interfaces where conductor paths and non-conductive areas come in direct contact to environmental layers, i.e. a third area or layer.

Next, further exemplary embodiments of the substrate for an electronic circuit are described. However, these embodiments also apply to the electronic circuit.
According to another exemplary embodiment the According to another exemplary embodiment of the substrate the contact areas are formed by contact vias. In particular, the dielectric areas may be formed circularly around the contact areas and may have a first diameter while the conductor path may comprise circularly portions having a second diameter which is greater than the first diameter. Moreover, the circularly portions of the conductor path may be formed on the dielectric areas. Thus, the dielectric areas or non-conductive areas may form a passivation layer around the contact areas. For example, the non-conductive areas may form an oxide, e.g. a silicon-oxide, silicon nitride or silicon-oxide-nitrogen, structuring a base-emitter of a bipolar-transistor.

According to another exemplary embodiment the substrate further comprises a plurality of conductor paths. In particular, the plurality of conductor paths may form a mesh-like structure or a line structure. The conductor paths may comprise or may be formed by metallic material, like aluminum, aluminum-silicon, aluminum-silicon-copper, gold other suitable metals. The conductor paths may be formed on a base surface of the substrate or may even be formed in vias leading from the base surface to an upper surface of the substrate on which upper surface semiconductor elements may be formed. Thus, the conductor paths may not only form layers connecting contact areas of a substrate with each other but may also form electrically contacting elements adapted to connect different layers or levels of an electronic package through a via or contact whole.

According to another exemplary embodiment of the substrate the conductor path comprises an elongated portion and a bulge portion, wherein the elongated portion is arranged between dielectric areas, and wherein the bulge portion is arranged over the dielectric area. In particular, the bulge portion or bulge area may form a substantially circular portion in case the non-conductive area is of a substantially circular shape as well. In general, the bulge portion may have a form or shape which is similar to the shape of the non-conductive area or passivation area. However, the size of the bulge area is chosen to be greater than the size of the passivation area so that it is possible that the bulge area completely covers the passivation area.

According to another exemplary embodiment of the substrate the bulge portion comprises circular segments corresponding to a first diameter, wherein the dielectric areas comprises circular segments corresponding to a second diameter, and wherein the second diameter is smaller than the first diameter. In particular, the bulge portions may have a substantially circular shape however at partitions the elongated portions and the bulge portions met each other the circular shape is deviated from.

According to another exemplary embodiment of the substrate a width of the elongated portion is adapted to an expected current flow through the conductor path. In particular, the width may be chosen smaller than in known substrates since according to the exemplary embodiment of the present invention the probability of weaknesses like necks or underetching is reduced. However, according to known structures these weaknesses are dealt with by providing conductor paths having a greater width than necessary for a given current. Thus, according to exemplary embodiments of the inventions it may be possible to reduce the width of the conductor paths in the elongated regions since the probability of occurrences of weaknesses is reduced.

According to another exemplary embodiment of the substrate the conductor path has a constant width along its extension. In particular, the width may be measured in a direction substantially perpendicular to a longitudinal extension of the conductor path. Moreover, the width may be constant along the whole extension or at least substantially along the whole extension. In particular, the conductor path may not comprise or may be free of bulge portions in which the width of the conductor path is increased or recess areas in which the width of the conductor path is decreased. Thus, a conductor path having a constant width may be provided, possibly leading to the fact that the manufacturing process of the conductor path may be simplified. However, it should be noted that the width of the conductor path is adapted to entirely cover the dielectric areas.

That is, the constant width of the conductor path may be greater than the width or diameter of the dielectric areas surrounding the contact areas.

According to another exemplary embodiment of the substrate the contact areas are formed by vias. In particular, the contact areas may be formed by conductive material used to fill the vias to provide an electrically conductive path through the substrate, e.g. for contacting a different level of an electronic package or for contacting electronic elements arranged on top of the substrate while the conductor paths are formed on the bottom or base of the substrate.

Summarizing, a gist of an exemplary aspect of the present invention may be seen in the provision of a mesh-like structured semiconductor circuit having metal conductor paths for concurrently contacting base contacts or contact areas of the semiconductor circuit. The conductor paths may be passed over the base contacts and may form electrical contacts for the base terminal of a bipolar transistor, wherein material of the conductor paths are also filled in the vias. The base contacts may be structured by two oxide layers, i.e. a so-called base-emitter oxide, which is formed annularly around the base contact, and a so-called contact oxide which provides in openings electrical contact of the metal conductor paths to active zones of the semiconductor circuit. For connecting the base contacts the conductor path crosses the base-emitter oxide which is formed around the base contact and which forms a step or stage. In known semiconductor circuits these steps formed by the base-emitter oxide introduce weaknesses since the adhesion between the conductor path and the base-emitter oxide is significantly reduced leading to underetching and neck formation when further processing is performed. According to the exemplary aspect of the invention this weaknesses are reduced by omitting the crossovers or intersection between the conductor paths and the base-emitter oxide by providing a conductor path having such a size that it totally covers the base-emitter oxide.

Thus, in general using periodic, especially mesh-like emitter structures, the device's performance, especially the current capability, the device's resistance and the noise properties can be significantly improved for bipolar semiconductor transistor devices. Metal conductor paths or lanes crossing the oxide edges at these periodic structures, as present in known substrates, are inherently undergoing severe adhesion problems at the oxide edges, which lead to metal underetching, especially the formation of metal grooves of the interconnection lanes. These grooves have severe impact on the device's performance and quality. By using a substrate according to exemplary embodiments of the invention having metal interconnection lanes around these base connection areas the crossing of metal lanes and oxides edges may be avoidable, which leads to higher device quality and performance and design flexibility.

The aspects and exemplary embodiments defined above and further aspects of the invention are apparent from the example of embodiment to be described hereinafter and are explained with reference to these examples of embodiment. It should be noted that features described in connection with one exemplary embodiment or exemplary aspect may be combined with other exemplary embodiments and other exemplary aspects.

BRIEF DESCRIPTION OF THE DRAWINGS

The invention will be described in more detail hereinafter with reference to examples of embodiment but to which the invention is not limited.

FIG. 1 schematically illustrates a base view of a mesh-like semiconductor circuit.

DESCRIPTION OF EMBODIMENTS

Figures 2A, 2B:
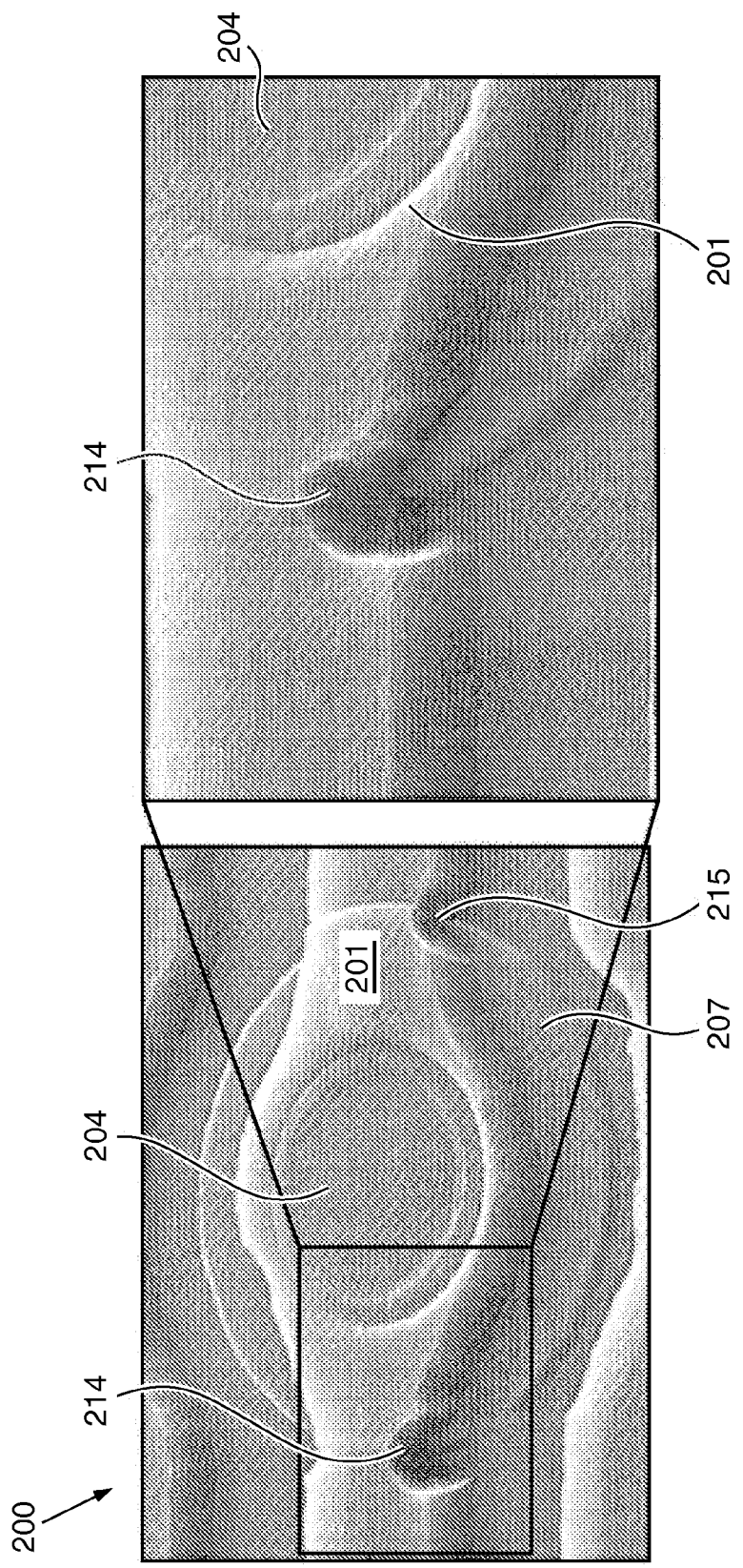
FIG. 2 shows a microscopic view of a known conductor path contacting a contact area.

The illustration in the drawing is schematically. In different drawings, similar or identical elements are provided with similar or identical reference signs.

FIG. 1 shows a schematically base view of a substrate 100 for an array of mesh-structured bipolar-transistors. The mesh-structure comprises a plurality of conductor paths 101, 102 and 103 formed by a metallic material. The conductor path 101 connects contact areas or contact vias 104, 105, 106, for example. The contact areas 104, 105, and 106 are surrounded by the so-called base-emitter oxide 107, 108, 109 forming a layer surrounding the contact areas or base contacts. Furthermore, the substrate comprises so-called contact oxide layers 110, 111, 112 and 113 which forms a hull of the contact vias or into which the vias are formed. A difference between the so-called base-emitter oxide and the contact oxide may be seen in the fact that the contact oxide may be formed by material of the substrate itself, while the so-called base-emitter oxide is formed by an additional layer formed on the base side of the substrate. According to the structure shown in FIG. 1 the conductor paths does not cover the whole base-emitter oxides, i.e. a crossover between conductor paths and the base-emitter oxide is present, so that a weakness in form of a neck or underetching may be formed during further processing of the structure.

In FIG. 2 a microscopic image of a contact area of FIG. 1 is shown. In particular, FIG. 2A shows a substrate 200 comprising a conductor path 201. Furthermore, a contact area 204 can be seen which is contacted by the conductor path 201. Moreover, a base-emitter oxide 207 can be seen which is crossed or intersected by the conductor path 201. As can be seen in the image depicted in FIG. 2A necks or lateral contractions and underetching 214 and 215 are formed in the regions the conductor path 201 is deposited onto the base-emitter oxide 207. In particular, the necks are basically formed only in the regions and starting from the regions in which the conductor path 201 reaches the base-emitter oxide, i.e. at the step which is formed by the base-emitter oxide. FIG. 2B shows a detailed view of the underetching and neck 214 which is induced by a reduced adhesion of the metal of the conductor path 201 on the step of the base-emitter oxide.

Figure 3:
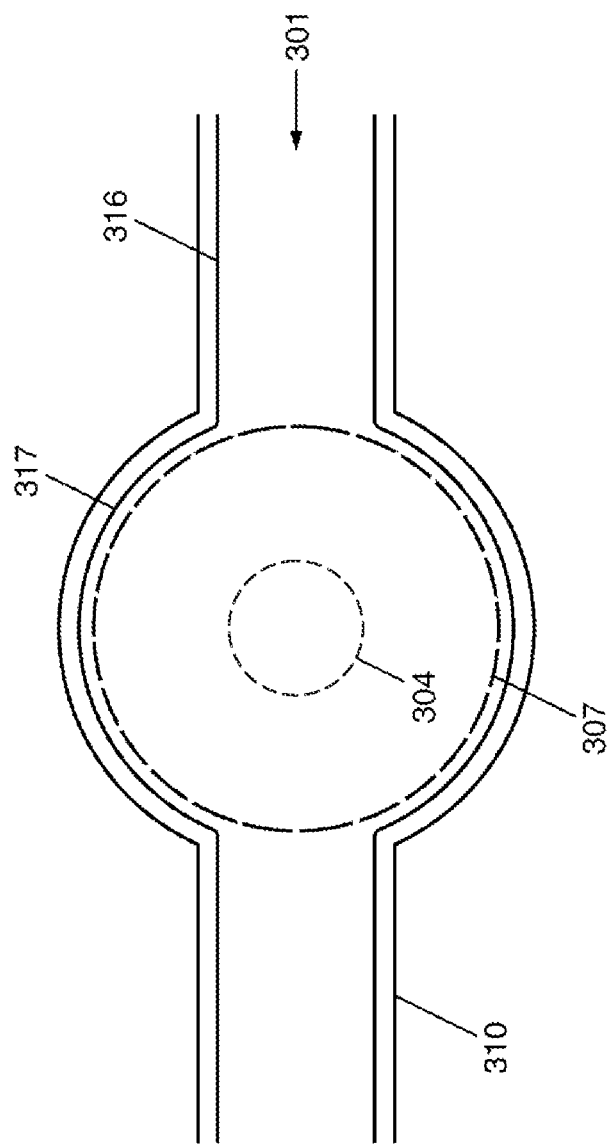
FIG. 3 schematically illustrates a base view of a contacting area according to a first exemplary embodiment of the invention.

FIG. 3 schematically illustrates a first exemplary embodiment of a substrate or structure for an electronic circuit. For sake of clarity only a region around a single via is depicted in FIG. 3. However, a mesh-like structure as depicted in FIG. 1 is also possible for the substrate according to the first exemplary embodiment. In particular, FIG. 3 shows a conductor path 301 arranged on a contact oxide layer 310. Furthermore, a contact area or 304 surrounded by a base-emitter oxide 307 is shown in FIG. 3. The contact area may be adapted to be connectable to a bipolar transistor. In contrast to the conductor paths shown in FIG. 1 the conductor path 301 shown in FIG. 3 comprises an elongated portion 316 and a bulge portion 317. The bulge portion 317 is substantially circular and has a diameter or width which is greater than the diameter of the base-emitter oxide 307. Thus, no crossover is present between the conductor path 301 and the base-emitter oxide 307 but the base-emitter oxide 307 is completely covered by the conductor path 301, in particular by the bulge portion of the conductor path 301. However, it should be noted that the conductor path 301 lies completely in the region of the contact oxide layer 310 so that no crossover is provided between these two layers. Since no crossovers are provided and the step generated by the base-emitter oxide 307 is not intersected by the conductor path, the probability of generating necks or underetching in the further processing is reduced.

Figure 4:
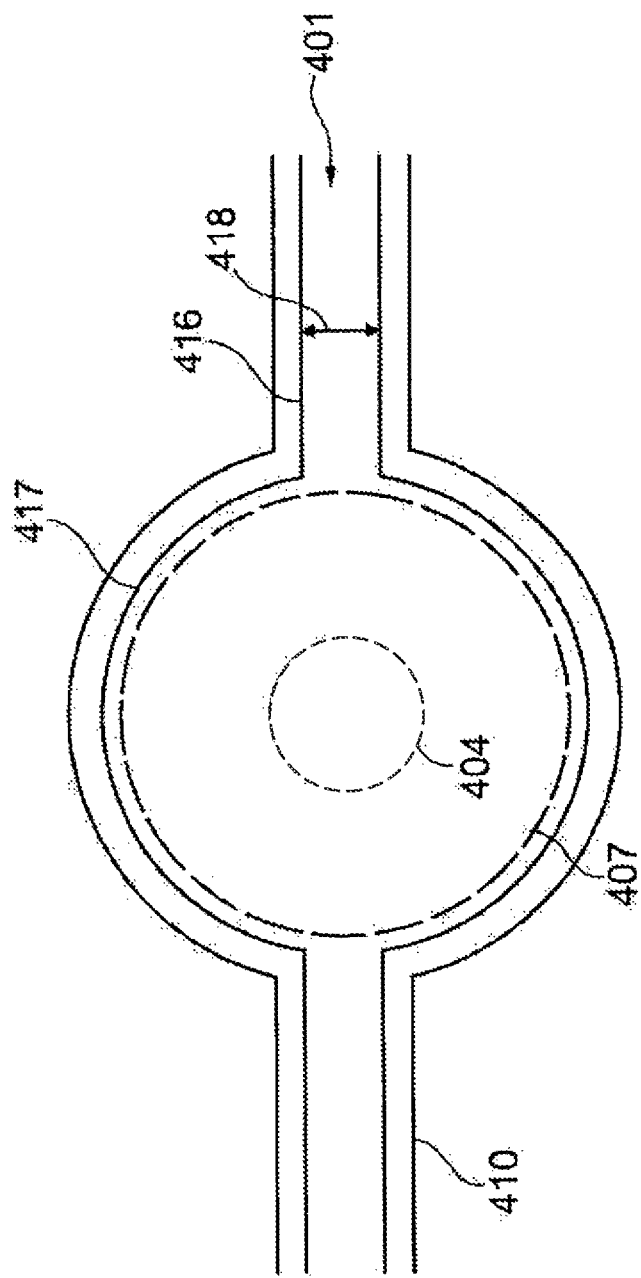
FIG. 4 schematically illustrates a base view of a contacting area according to a second exemplary embodiment of the invention.

FIG. 4 schematically illustrates a second exemplary embodiment of a substrate or structure for an electronic circuit which is similar to the one shown in FIG. 3. For sake of clarity only a region around a single via is depicted in FIG. 4. However, a mesh-like structure as depicted in FIG. 1 is also possible for the substrate according to the second exemplary embodiment. In particular, FIG. 4 shows a conductor path 401 arranged on a contact oxide layer 410. Furthermore, a contact area or 404 surrounded by a base-emitter oxide 407 is shown in FIG. 4. In contrast to the conductor paths shown in FIG. 1 the conductor path 401 shown in FIG. 4 comprises an elongated portion 416 and a bulge portion 417. The bulge portion 417 is substantially circular and has a diameter or width which is greater than the diameter of the base-emitter oxide 407. Thus, no crossover is present between the conductor path 401 and the base-emitter oxide 407 but the base-emitter oxide 407 is completely covered by the conductor path 401, in particular by the bulge portion of the conductor path 401. However, compared to the elongated portion of the conductor path 301 in FIG. 3 the elongated portion 416 of the conductor path 401 and the contact oxide layer 410 has a reduced width indicated by the arrows 418. The elongated portion 416 which forms the connection between contact areas or vias may have a smaller width than in known substrates since the probability of forming of necks is reduced so that the width may be adapted to a specific maximum current density in the conductor path. The maximum current density may be chosen so that electromigration is reduced to a suitable level. Thus, according to an embodiment of the invention it may be possible to produce substrates having conductor paths with smaller widths. The saved areas may be used to increase the contact areas or even the number of contact areas provided on a substrate having the same size. By increasing the size of the contact areas of a substrate it may be possible to increase the performance of an electronic circuit using the substrate. In particular, the current may be increased while the resistance may be decreased.

However, it should be noted that the conductor path 401 lies completely in the region of the contact oxide layer 410 so that no crossover is provided between these two layers. Since no crossovers are provided and the step generated by the base-emitter oxide 407 is not intersected by the conductor path, the probability of generating necks or underetching in the further processing is reduced.

Figure 5:
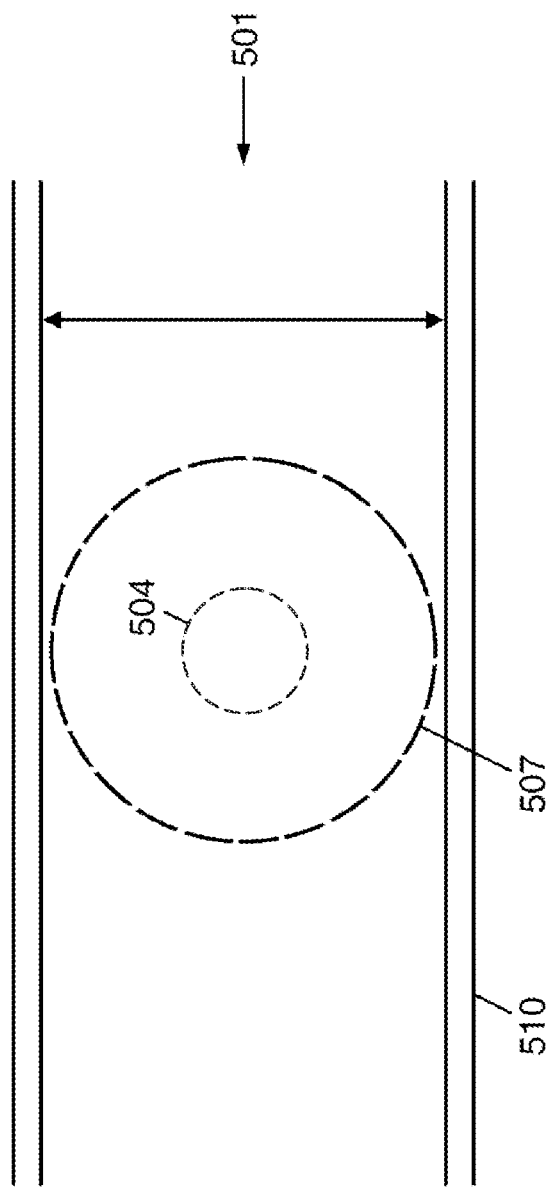
FIG. 5 schematically illustrates a base view of a contacting area according to a third exemplary embodiment of the invention.

FIG. 5 schematically illustrates a third exemplary embodiment of a substrate or structure for an electronic circuit which is similar to the one shown in FIG. 3. For sake of clarity only a region around a single via is depicted in FIG. 5. However, a mesh-like structure as depicted in FIG. 1 is also possible for the substrate according to the third exemplary embodiment. In particular, FIG. 5 shows a conductor path 501 arranged on a contact oxide layer 510. Furthermore, a contact area or 504 surrounded by a base-emitter oxide 507 is shown in FIG. 5. In contrast to the conductor paths shown in FIG. 3 the conductor path 501 shown in FIG. 5 comprises no elongated portion and no bulge portion. On contrast, the conductor path 501 has a constant width and is adapted in such a way that it is identical or greater than the diameter of the base-emitter oxide 507. Thus, no crossover is present between the conductor path 501 and the base-emitter oxide 507 but the base-emitter oxide 507 is completely covered by the conductor path 501. In particular, the manufacturing process for a substrate shown in FIG. 5 may be simplified due to the fact that the conductor path 501 has a constant width.

However, it should be noted that the conductor path 501 lies completely in the region of the contact oxide layer 510 so that no crossover is provided between these two layers. Since no crossovers are provided and the step generated by the base-emitter oxide 507 is not intersected by the conductor path, the probability of generating necks or underetching in the further processing is reduced.

Finally, it should be noted that the above-mentioned embodiments illustrate rather than limit the invention, and that those skilled in the art will be capable of designing many alternative embodiments without departing from the scope of the invention as defined by the appended claims. In the claims, any reference signs placed in parentheses shall not be construed as limiting the claims. The word "comprising" and "comprises", and the like, does not exclude the presence of elements or steps other than those listed in any claim or the specification as a whole. The singular reference of an element does not exclude the plural reference of such elements and vice-versa. In a device claim enumerating several means, several of these means may be embodied by one and the same item. The mere fact that certain measures are recited in mutually different dependent claims does not indicate that a combination of these measures cannot be used to advantage.

The invention claimed is:

1. A substrate for an electronic circuit, the substrate comprising:
   a plurality of contact areas,
   a plurality of dielectric areas formed around the contact areas, wherein the dielectric areas comprise a base-emitter of a bipolar-transistor made of oxide, and
   a conductor path made of a metallic material,
   wherein each of the plurality of contact areas is completely surrounded by and in contact with a respective one of the dielectric areas,
   wherein at least two of the contact areas are connected with each other by the conductor path, and
   wherein the conductor path completely covers the contact areas and the dielectric areas, wherein the dielectric areas are completely located in a first plane and the conductor path is completely located in a second plane that is vertically separated from and in parallel with the first plane such that there is no crossover between the conductor path and the dielectric areas, wherein the conductor path comprises an elongated portion having a rectangular shape with a constant width and a bulge portion having a circular shape, wherein the elongated portion is in contact with the bulge portion on two sides of the circular shape, and wherein the elongated portion and the bulge portion of the conductor path are completely located in the second plane.

2. The substrate according to claim 1,
   wherein the contact areas are formed by contact vias.

3. The substrate according to claim 1, further comprising:
   a plurality of conductor paths.

4. The substrate according to claim 1,
   wherein the elongated portion is arranged between dielectric areas, and
   wherein the bulge portion is arranged over the dielectric area.

5. The substrate according to claim 4,
   wherein the bulge portion comprises circular segments corresponding to a first diameter,
   wherein the dielectric areas comprises circular segments corresponding to a second diameter,
   wherein the second diameter is smaller than the first diameter.

6. The substrate according to claim 4,
   wherein a width of the elongated portion is adapted to an expected current flow through the conductor path.

7. An electronic circuit comprising
   a substrate according to claim 1, and
   a semiconductor device,
   wherein the semiconductor device is electrically connected to the contact areas.

8. The electronic circuit according to claim 7, further comprising:
   a plurality of semiconductor devices,
   wherein at least some of the semiconductor devices are formed by transistors, in particular bipolar transistors.

* * * * *